United States Patent [19]

Le Craw et al.

[11] 4,419,417
[45] Dec. 6, 1983

[54] MAGNETIC DOMAIN DEVICE HAVING A WIDE OPERATIONAL TEMPERATURE RANGE

[75] Inventors: Roy C. Le Craw, Westfield; Lars C. Luther, Basking Ridge; Terence J. Nelson, New Providence, all of N.J.

[73] Assignee: Bell Telephone Laboratories, Incorporated, Murray Hill, N.J.

[21] Appl. No.: 319,609

[22] Filed: Nov. 9, 1981

[51] Int. Cl.$^3$ ............................................. G11C 11/14
[52] U.S. Cl. ........................................ 428/692; 365/33; 156/610; 156/617 SP; 156/621; 156/DIG. 63; 252/62.57; 252/62.58; 252/62.59; 428/693; 428/700; 428/900
[58] Field of Search ............... 428/900, 692, 700, 693, 428/323, 328, 329; 156/610, 621, 617 SP, DIG. 63; 365/33; 252/62.57, 62.58, 62.59

[56] References Cited

U.S. PATENT DOCUMENTS

| | | | |
|---|---|---|---|
| 3,648,260 | 3/1972 | Gyorgy et al. | 252/62.57 |
| 4,002,803 | 1/1977 | Blank | 428/900 |
| 4,018,692 | 4/1977 | Akselrad et al. | 252/62.57 |
| 4,034,358 | 7/1977 | Blank | 252/62.57 |
| 4,165,410 | 8/1979 | Blank | 428/900 |

Primary Examiner—Ellis P. Robinson
Attorney, Agent, or Firm—Peter A. Businger

[57] ABSTRACT

Yttrium-iron magnetic domain materials having bismuth ions on dodecahedral sites are suitable for the manufacture of high-density, high-speed magnetic domain devices for operation at high and especially at very low temperatures. In these devices magnetic domain velocity is greater than 2000 centimeters per second per oersted, and magnetic domain diameter is less than 3 micrometers. A specified operational temperature range may extend from $-150$ to $150$ degrees C.; accordingly, such devices are particularly suitable for operation aboard satellites, e.g., in satellite communications systems.

7 Claims, 3 Drawing Figures

MAGNETIC DOMAIN DEVICE HAVING A WIDE OPERATIONAL TEMPERATURE RANGE

TECHNICAL FIELD

The invention is concerned with magnetic domain or "bubble" devices and, more particularly, with devices having high potential information density and operating speed over an extended operational temperature range.

BACKGROUND OF THE INVENTION

Magnetic domain devices are being used primarily as sequential-access memory devices in which information is stored in digital form. Functionally, such memory devices may typically comprise a number of shift registers ("minor loops") each of which is in communication with a common, "major loop" shift register. Information is represented by the presence or absence of magnetic domains in a layer of magnetic material, and the function of shifting is effected by means of a magnetic field which may be controlled as to strength and direction.

In a preferred device structure magnetic domains are nucleated and propagated in a layer of magnetic garnet material which is deposited on a nonmagnetic garnet substrate having lattice parameters which are compatible with those of the magnetic layer. Typically, the substrate is made of gadolinium-gallium garnet material and the magnetic layer is patterned after yttrium-iron garnet, $Y_3Fe_5O_{12}$ (YIG). Magnetic layers of desirable composition and quality can be deposited on a gadolinium-gallium substrate by a process known as liquid phase epitaxy (LPE) as generally described, e.g., by M. H. Randles, "Liquid Phase Epitaxial Growth of Magnetic Garnets", *Crystals for Magnetic Applications*, Springer, 1978, pp. 71-96.

Magnetic domain propagation paths may be defined in a layer of magnetic materials, e.g., by a patterned overlying metallic layer or by a pattern resulting from selective ion implantation. Representative of the latter approach are designs as disclosed, e.g., in U.S. Pat. No. 4,249,249, issued Feb. 3, 1981 to P. I. Bonyhard et al. and in the paper by T. J. Nelson et al., "Design of Bubble Device Elements Employing Ion-Implanted Propagation Patterns", *Bell System Technical Journal*, Vol. 59 (1980), pp. 229-257.

Desired magnetic anisotropy in a layer of magnetic material results in an "easy direction" of magnetization which is perpendicular to the layer and which renders the layer capable of sustaining magnetic domains whose magnetization is antiparallel to the magnetization of layer material surrounding the domains. Magnetic anisotropy may be "strain induced" as understood to be due to an appropriate disparity between crystallographic lattice dimensions of supported layer and substrate. Alternatively, anisotropy may be "growth induced" as considered to be due to local strain or preferential ordering realized upon deposition of a material in which a crystallographic site such as, e.g., the dodecahedral site is occupied by a mixed ion population. The distinction is made, e.g., in U.S. Pat. No. 3,886,533, issued to W. A. Bonner et al. on May 27, 1975.

Continuing development effort is aimed primarily at reducing magnetic domain size while maintaining or increasing domain wall mobility. Considerable progress has been made towards fast devices having high packing density as illustrated, e.g., by D. J. Breed et al., "Garnet Films for Micron and Submicron Magnetic Bubbles with Low Damping Constants", *Applied Physics*, Vol. 24 (1981), pp. 163-167, and by J. M. Robertson et al., "Garnet Compositions for Submicron Bubbles with Low Damping Constants", *Journal of Applied Physics*, Vol. 52 (1981), pp. 2338-2340.

Recently, a need has arisen for devices to operate in inhospitable environments such as, e.g., aboard space stations where operation may be required over a wide temperature range and, in particular, over a range which extends to very low temperatures.

SUMMARY OF THE INVENTION

It is an object of the invention to provide magnetic domain devices which are operable over a wide temperature range comprising low temperatures.

Within the scope of the invention is a magnetic domain device whose operation is based on magnetic domains in a supported layer of a magnetic garnet material having uniaxial magnetic anisotropy in a direction which is essentially perpendicular to the layer. The magnetization of such a magnetic domain is essentially antiparallel to the magnetization of a portion of the magnetic film surrounding the domain, the diameter of such a domain is less than 3 micrometers, and the mobility of a domain is greater than 2000 centimeters per second per oersted.

The device is characterized in that the supported layer consists essentially of a bismuth-containing garnet material whose composition is essentially as denoted by the formula

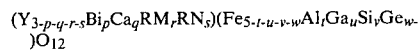

$$(Y_{3-p-q-r-s}Bi_pCa_qRM_rRN_s)(Fe_{5-t-u-v-w}Al_tGa_uSi_vGe_w)O_{12}$$

where RM denotes one or both of the magnetic rare earth elements Eu and Sm, where RN denotes one or several of the small-ionic-radius rare earth elements Lu, Tm, and Yb, and where p is in a preferred range of 0.2-1.5,
q is in a preferred range of 0.2-0.9,
r is in a preferred range of 0.0-0.3,
s is in a preferred range of 0.0-0.6,
t is in a preferred range of 0.0-1.0,
u is in a preferred range of 0.0-1.0,
v is in a preferred range of 0.2-0.9,
w is in a preferred range of 0.0-0.9,
and where v+w is approximately equal to q.

The resulting devices are suitable for operation over a wide range of temperatures; specifically, such operational range comprises a range of −150 to 150 degrees C.

Also within the scope of the invention is a method of transmitting signals involving nucleating, propagating, or detecting magnetic domains in a layer of magnetic garnet material whose composition is essentially as denoted by a formula as stated above, where p, r, s, t, u, and w are in preferred ranges as stated above, where q is in the range of 0.0-0.9 and where v is in the range of 0.0-0.9. Nucleating, propagating, or detecting magnetic domains is in an environment corresponding to a specified operational temperature range which comprises a temperature in the range of −150 to 0 degrees C.

DETAILED DESCRIPTION

Figure 1:
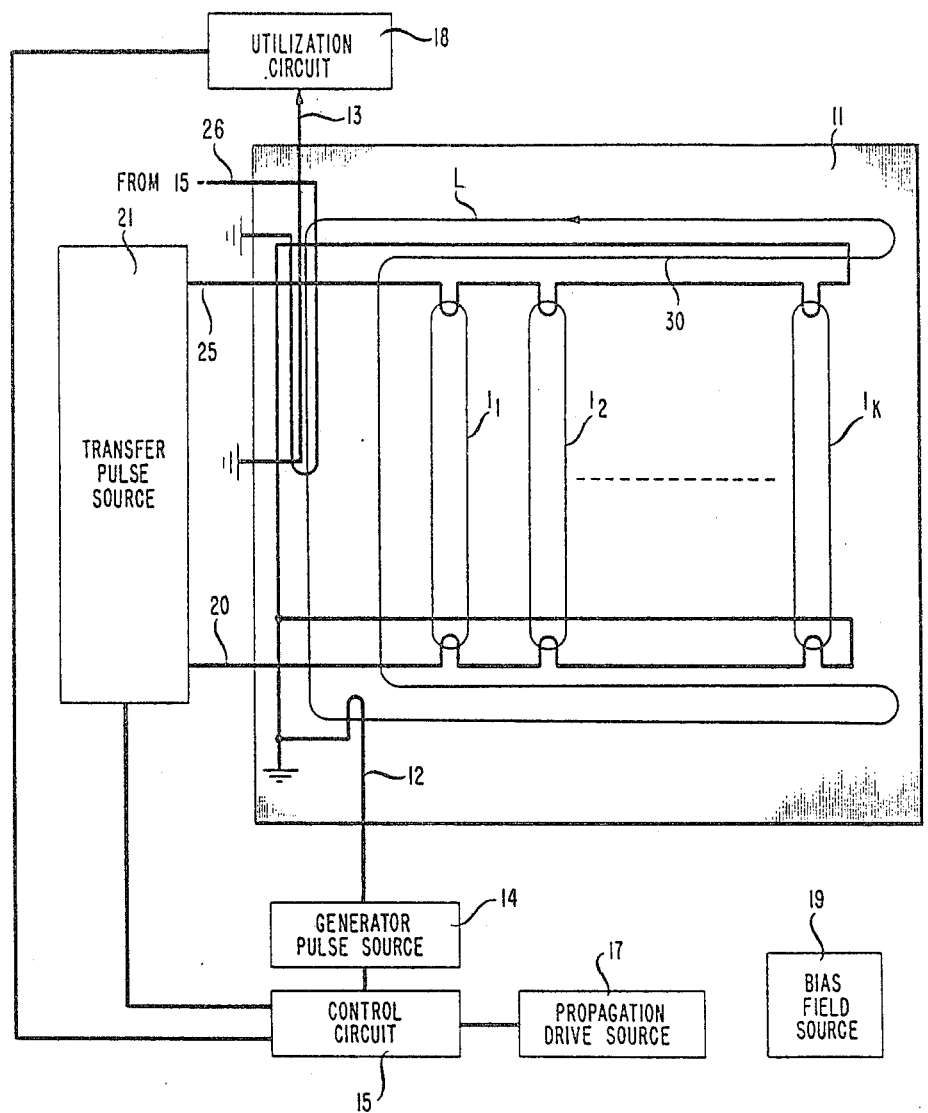
FIG. 1 shows schematically and greatly enlarged a magnetic domain device in accordance with the invention.

FIG. 1 shows a magnetic domain device comprising magnetic garnet layer 11. Magnetic domains or bubbles propagate in layer 11 along closed paths or loops $l_1$, $l_2$, ... $l_k$ which are commonly referred to as minor loops. Bubbles also propagate along closed path or loop L which is commonly referred to as a major loop. Generator 12 serves to nucleate bubbles and comprises an electrical conductor which is connected to a generator pulse source 14 which, in turn, is controlled by control circuit 15. Also controlled by control circuit 15 is propagation drive source 17. Detector 13 serves to detect the presence of bubbles in response to an electrical pulse in conductor 26; detector 13 is shown connected to a utilization circuit 18. Bubbles are maintained at a nominal diameter by a bias field supplied by source 19. Conductor 20 provides for coupling of minor loops $l_1$, $l_2$, ..., $l_k$ to major loop L; specifically, when a suitable electrical pulse is supplied by transfer pulse source 21 to conductor 20, bubbles are transferred from the major loop L to minor loops $l_1$, $l_2$, ..., $l_k$ in response to rotation of an in-plane drive field produced by source 17. Similarly, bubbles are transferred from the minor loops $l_1$, $l_2$, ..., $l_k$ to the major loop L when a suitable pulse is supplied to conductor 25. Control of the transfer function as well as the operations of generation, propagation, and detection is understood to be synchronized by clock circuitry comprised in control circuit 15. Further structural details of the device in accordance with FIG. 1 can be found in the above-identified U.S. Pat. No. 4,249,249 and the above-identified paper by T. J. Nelson et al. which are concerned primarily with devices in which bubble paths such as minor and major loops are defined by ion implanted regions. The invention may alternatively be implemented, e.g., as a device in which such paths are defined by patterned metallic overlays; see, e.g., A. H. Bobeck et al., "Current-Access Magnetic Bubble Circuits", *Bell System Technical Journal*, Vol. 58, No. 6 (July–August 1979), pp. 1453–1540.

In accordance with the invention the material of layer 11 is a magnetic garnet material having a composition which is essentially as specified above. The thickness of layer 11 is approximately equal to the desired bubble diameter which, in the interest of high packing density, is less than 3 micrometers. Such small-diameter bubbles in layer 11 have a mobility which is greater than 2000 centimeters per second per oersted.

Figure 2:
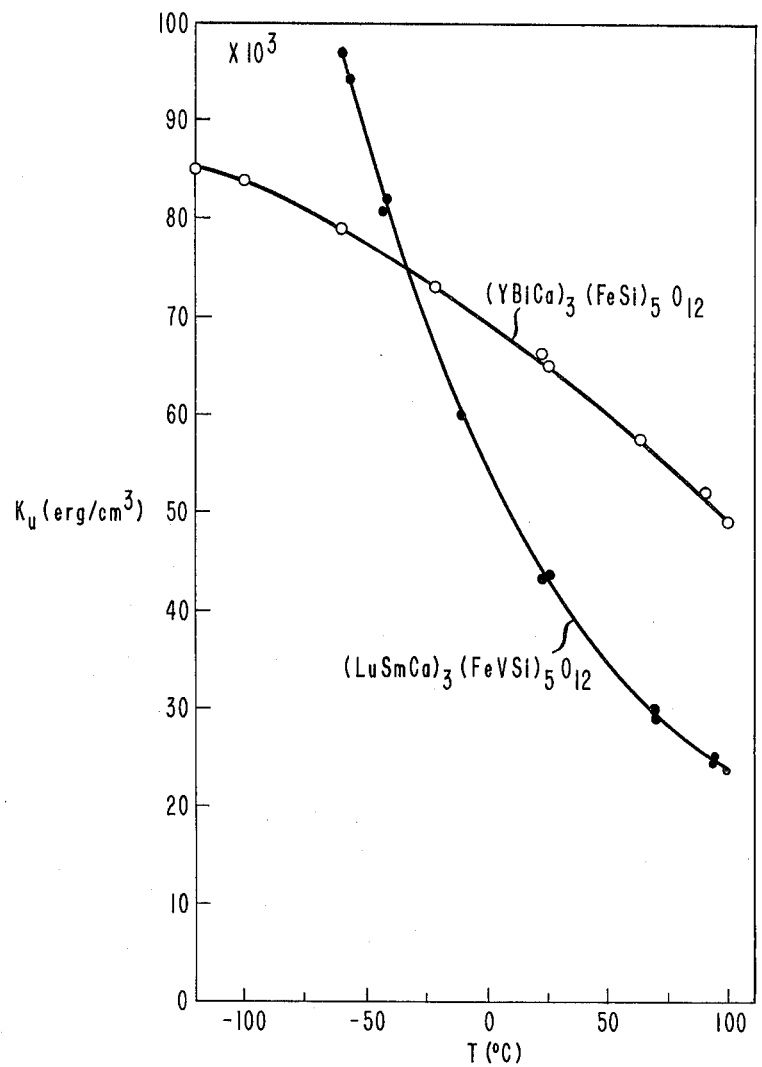
FIG. 2 illustrates a functional relationship between temperature and magnetic anisotropy for a magnetic layer in accordance with the invention as compared with a prior art layer.
Figure 3:
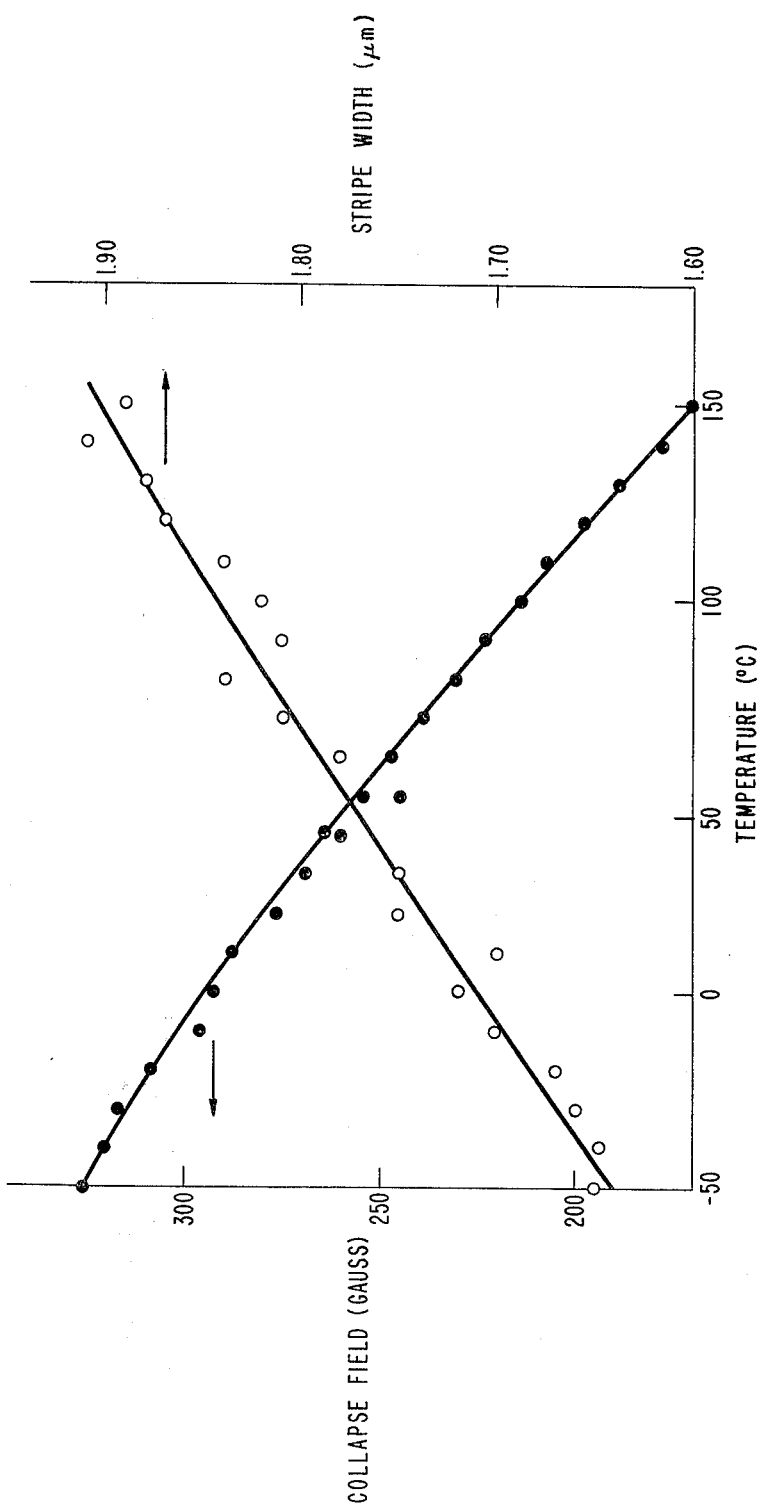
FIG. 3 illustrates functional relationships between temperature and stripe width as well as between temperature and collapse field for a magnetic layer in accordance with the invention.

Devices in accordance with the invention are operable over a wide temperature range as stated above and as may be appreciated upon inspection of FIG. 2 and FIG. 3. Specifically, FIG. 2 graphically illustrates temperature dependence of magnetic anisotropy $K_u$ for a bismuth-containing magnetic layer in accordance with the invention and identified by the nonspecific formula $(YBiCa)_3(FeSi)_5O_{12}$. Also illustrated by FIG. 2 is a corresponding relationship for a prior-art material as identified by the nonspecific formula $(LuSmCa)_3(FeVSi)_5O_{12}$, and it can be seen that $K_u$ is more nearly constant for the material of the invention as is desirable in the interest of operation in a wide temperature range. Similarly, FIG. 3 shows a favorable temperature dependence of stripe width and collapse field for a magnetic layer in accordance with the invention. If a high-temperature range is desired which is greater still, then t may be chosen less than or equal to 0.6 and u less than or equal to 0.7. Resulting devices are preferably used where operation up to 200 degrees C. is specified. If, in a device based on a gadolinium-gallium garnet substance, magnetic domain size is desired to be less than 1 micrometer, then the presence of rare earth elements is preferred. In this case, the magnetic garnet material preferably contains magnetic rare earth elements ($RM_r$) in an amount corresponding to a value of r greater than or equal to 0.1 and small-ionic-radius rare earth elements ($RN_s$) in an amount corresponding to a value of s greater than or equal to 0.1.

All compositions are understood to allow for small amounts of impurities as may unavoidably be present in a deposited layer of magnetic material. It is desirable to minimize the presence of impurities, e.g., lead is preferably kept below 0.05 atoms per formula unit of garnet, platinum below 0.04 atoms per formula unit of garnet, and rhodium, iridium, and cobalt in combination below 0.005 atoms per formula of garnet.

Anisotropy in a magnetic layer of the invention is preferably growth-induced; accordingly, approximate matching of lattice constants at a substrate-layer interface is desirable. Strain-induced contribution to magnetic anisotropy is preferably less than 30 percent and more preferably less than 15 percent.

Devices of the invention may be used for signal transmission functions such as, typically, data storage and retrieval as described above in connection with FIG. 1, data being represented by the presence or absence of bubbles in a magnetic layer having a composition as described above. In accordance with the invention, such functions are carried out when the device is in an inhospitable environment as characterized, e.g., by a specified operational temperature range which comprises a temperature in the range of −150 to 0 degrees C. or at least in the range of −150 to −50 degrees C.

The following are examples of typical conditions utilized in the deposition of garnet epitaxial layers in accordance with the invention by liquid phase epitaxy.

EXAMPLE 1

A circular gadolinium-gallium garnet substrate measuring approximately 2.0 inches in diameter and 20 mils in thickness was used as a deposition substrate. The substrate was cleaned, dried, and inserted in a substrate holder of apparatus equipped with a platinum crucible containing a previously prepared melt. The melt had been obtained by melting 2.39 grams $Y_2O_3$, 292 grams $Bi_2O_3$, 1.135 grams CaO, 5 grams $SiO_2$, 66.1 grams $Fe_2O_3$, and 638 grams PbO; the melt was heated by resistance-heating coils to a temperature of approximately 1000 degrees C. The melt was allowed to react at this temperature for a period of approximately 16 hours.

The temperature of the melt was then lowered to a growth temperature of approximately 780 degrees C. and the substrate was lowered to within 1 centimeter of the melt surface. The substrate was maintained in this position for approximately 6 minutes. The substrate was then immersed approximately 2 centimeters deep into the melt and rotated at a rate of 100 RPM. Immersion was for a duration of approximately 1 minute, and the substrate was then removed from the melt to a position 1 centimeter above the melt while rotation continued. The rotation rate was then increased to 400 RPM for a period of approximately 30 seconds. The rotation was stopped, and the substrate was withdrawn further at a rate of approximately 0.5 centimeters per minute.

By standard measurement techniques the following physical properties were determined for the deposited layer: A layer thickness of approximately 1.15 micrometers, a magnetic domain stripe width of approximately 1 micrometer, a saturation magnetization (commonly designated as $4\pi M_s$) of approximately 775 gauss, an anisotropy field (commonly designated as $H_k$) of approximately 1800 gauss, a material length parameter (commonly designated as l) of approximately 0.11 micrometer, a lattice constant (commonly designated as $a_o$) of approximately 12.390 Angstroms, and a uniaxial anisotropy (commonly designated as $K_u$) of approximately 55,500 erg/cm$^3$.

Composition of the layer was determined as represented approximately by the formula $\{Y_{1.9}Bi_{0.5}Ca_{0.6}\}(Fe_{4.4}Si_{0.6})O_{12}$, and its magnetic anisotropy was found to vary as a function of temperature as represented in FIG. 2.

EXAMPLE 2

A circular gadolinium-gallium garnet substrate measuring approximately 2.0 inches in diameter and 20 mils in thickness was used as a deposition substrate. The substrate was cleaned, dried, and inserted in a substrate holder of apparatus equipped with a platinum crucible containing a previously prepared melt. The melt had been obtained by melting 3 grams $Y_2O_3$, 400 grams $Bi_2O_3$, 2 grams CaO, 4.8 grams $SiO_2$, 8 grams $GeO_2$, 92 grams $Fe_2O_3$, and 800 grams PbO; the melt was heated by resistance-heating coils to a temperature of approximately 1000 degrees C. The melt was allowed to react at this temperature for a period of approximately 16 hours.

The temperature of the melt was then lowered to a growth temperature of approximately 800 degrees C. and the substrate was lowered to within 1 centimeter of the melt surface. The substrate was maintained in this position for approximately 6 minutes. The substrate was then immersed approximately 2 centimeters deep into the melt and rotated at a rate of 100 RPM. Immersion was for a duration of approximately 1.5 minutes, and the substrate was then removed from the melt to a position 1 centimeter above the melt while rotation continued. The rotation rate was then increased to 400 RPM for a period of approximately 30 seconds. The rotation was stopped, and the substrate was withdrawn further at a rate of approximately 0.5 centimeters per minute.

By standard measurement techniques the following physical properties were determined for the deposited layer: A layer thickness of approximately 1.85 micrometers, a magnetic domain stripe width of approximately 1.65 micrometers, a saturation magnetization of approximately 535 gauss, an anisotropy field of approximately 1725 gauss, a material length paremeter of approximately 0.205 micrometer, a lattice constant of approximately 12.384 Angstroms, and a uniaxial anisotropy of approximately 31,500 erg/cm$^3$.

Composition of the layer was determined as represented approximately by the formula $\{Y_{2.0}Bi_{1.3}Ca_{0.7}\}(Fe_{4.3}Si_{0.4}Ge_{0.3})O_{12}$, and its collapse field and stripe width were found to vary as a function of temperature as represented by FIG. 3.

EXAMPLE 3

A circular gadolinium-gallium garnet substrate approximately 2.0 inches in diameter and 20 mils in thickness was used as a deposition substrate. The substrate was cleaned, dried, and inserted in a substrate holder of apparatus equipped with a platinum crucible containing a previously prepared melt. The melt had been obtained by melting 2.82 grams $Y_2O_3$, 398 grams $Bi_2O_3$, 1.00 gram $Sm_2O_3$, 3.20 grams $Lu_2O_3$, 1.04 grams CaO, 6.50 grams $SiO_2$, 113.2 grams $Fe_2O_3$, and 1033.6 grams PbO; the melt was heated by resistance-heating coils to a temperature of approximately 1000 degrees C. The melt was allowed to react at this temperature for a period of approximately 16 hours.

The temperature of the melt was then lowered to a growth temperature of approximately 803 degrees C. and the substrate was lowered to within 1 centimeter of the melt surface. The substrate was maintained in this position for approximately 6 minutes. The substrate was then immersed approximately 2 centimeters deep into the melt and rotated at a rate of 100 RPM. Immersion was for a duration of approximately 10 seconds, and the substrate was then removed from the melt to a position 1 centimeter above the melt while rotation continued. The rotation rate was then increased to 400 RPM for a period of approximately 30 seconds. The rotation was stopped, and the substrate was withdrawn further at a rate of approximately 0.5 centimeters per minute.

By standard measurement techniques the following physical properties were determined for the deposited layer: A layer thickness of approximately 0.56 micrometers, a magnetic domain stripe width of approximately 0.64 micrometers, a saturation magnetization of approximately 1264 gauss, a collapse field of approximately 605 gauss, a material length parameter of approximately 0.076 micrometer, a lattice constant of approximately 12.4017 Angstroms, a uniaxial anisotropy of approximately 103,000 erg/cm$^3$, and a wall energy of approximately 0.96 erg/cm$^2$.

Composition of the layer was determined as represented approximately by the formula $\{Y_{1.3}Bi_{0.7}Ca_{0.3}Sm_{0.25}Lu_{0.5}\}(Fe_{4.7}Si_{0.3})O_{12}$.

What is claimed is:

1. Device comprising a supported layer of a magnetic garnet material having uniaxial magnetic anisotropy in a direction which is essentially perpendicular to said layer, said layer being capable of sustaining a magnetic domain whose magnetization is essentially antiparallel to the magnetization of a portion of said layer surrounding said domain, said domain having a diameter which is less than 3 micrometers, and said domain having mobility which is greater than 2000 centimeters per second per oersted, said device being characterized in that the composition of said garnet material is essentially as denoted by the formula $(Y_{3-p-q-r-s}Bi_pCa_qRM_rRN_s)(Fe_{5-t-u-v-w}Al_Hd_tGa_uSi_vGe_w)O_{12}$ where RM denotes one or both of the magnetic rare earth elements Eu and Sm, where RN denotes one or several of the small-ionic-radius rare earth elements Lu, Tm, and Yb, where p is in the range of 0.2–1.5, q is in the range of 0.2–0.9, r is in the range of 0.0–0.3, s is in the range of 0.0–0.6, t is in the range of 0.0–1.0, u is in the range of 0.0–1.0, v is in the range of 0.2–0.9, w is in the range of 0.0–0.9, and where v+w is essentially equal to q whereby said device has an operational temperature range which comprises the range of −150 to 150 degrees C.

2. Device of claim 1 in which said layer has a magnetic anisotropy which is predominantly as growth induced, an amount of less than 30 percent of said anisotropy being strain induced.

3. Device of claim 1 in which said garnet material comprises less than 0.05 atoms of lead per formula unit of garnet, less than 0.04 atoms of platinum per formula unit of garnet, and less than 0.005, atoms of rhodium, iridium, and cobalt in combination per formula unit of garnet.

4. Device of claim 1 in which aluminum is present in said layer in an amount corresponding to a value of t less than or equal to 0.6, in which gallium is present in said layer in an amount corresponding to a value of u less than or equal to 0.7, whereby said device has an operational temperature range which comprises the range of −150 to 200 degrees C.

5. Device of claim 1 in which said diameter is less than 1 micrometer, in which said layer is supported by a gadolinium-gallium garnet substrate, in which said layer comprises one or several magnetic rare earth elements corresponding to a value of r greater than or equal to 0.1, and in which said layer comprises one or several nonmagnetic rare earth elements corresponding to a value s greater than or equal to 0.1.

6. Method for transmitting signals, said method comprising nucleating, propagating, or detecting magnetic domains in a supported layer of a magnetic garnet material having uniaxial magnetic anisotropy in a direction which is essentially perpendicular to said layer, said layer being capable of sustaining a magnetic domain whose magnetization is essentially antiparallel to the magnetization of a portion of said layer surrounding said domain, said domain having a diameter which is less than 3 micrometers, and said domain having mobility which is greater than 2000 centimeters per second per oersted, said method being characterized in that the composition of said garnet material is essentially as denoted by the formula $(Y_{3-p-q-r-s}Bi_pCa_qRM_rRN_s)(Fe_{5-t-u-v-w}Al_tGa_uSi_vGe_w)O_{12}$ where RM denotes one or both of the magnetic rare earth elements Eu and Sm, where RN denotes one or several of the small-ionic-radius rare earth elements Lu, Tm, and Yb, where p is in the range of 0.2–1.5, q is in the range of 0.2–0.9, r is in the range of 0.0–0.3, s is in the range of 0.0–0.6, t is in the range of 0.0–1.0, u is in the range of 0.0–1.0, v is in the range of 0.2–0.9, w is in the range of 0.0–0.9, and where v+w is essentially equal to q, and said nucleating, propagating, or detecting being in an environment corresponding to a specified operational temperature range which comprises a temperature in the range of −150 to 0 degrees C.

7. Method of claim 6 in which said specified operational temperature range comprises a temperature in the range of −150 to −50 degrees C.

* * * * *

UNITED STATES PATENT AND TRADEMARK OFFICE
CERTIFICATE OF CORRECTION

PATENT NO. : 4,419,417

DATED : December 6, 1983

INVENTOR(S) : Roy C. Le Craw, Lars C. Luther and Terence J. Nelson

It is certified that error appears in the above-identified patent and that said Letters Patent is hereby corrected as shown below:

In the Specification, column 5, line 14, "gauss" should read --oersteds--; line 60, "gauss" should read --oersteds--; line 60, "paremeter" should read --parameter--; line 65, "$Bi_{1.3}$" should read --$Bi_{0.3}$--. Column 6, line 36, "gauss" should read --oersteds--.

In the Claims, column 6, lines 58-59, "$(Fe_{5-t-u-v-w}AlHd\ tGa_u Si_v Ge_w)$" should read --$(Fe_{5-t-u-v-w}Al_t Ga_u Si_v Ge_w)$--.

Signed and Sealed this

Twenty-seventh Day of March 1984

[SEAL]

Attest:

GERALD J. MOSSINGHOFF

Attesting Officer   Commissioner of Patents and Trademarks

UNITED STATES PATENT AND TRADEMARK OFFICE
CERTIFICATE OF CORRECTION

PATENT NO. : 4,419,417

DATED : December 6, 1983

INVENTOR(S) : Roy C. Le Craw, Lars C. Luther and Terence J. Nelson

It is certified that error appears in the above-identified patent and that said Letters Patent is hereby corrected as shown below:

In the Specification, column 1, after line 9, add --The Government has rights in this invention pursuant to Contract F33615-81-C-1404 awarded by the Department of the Air Force.--.

Signed and Sealed this

Fourth Day of June 1985

[SEAL]

Attest:

DONALD J. QUIGG

Attesting Officer   Acting Commissioner of Patents and Trademarks